United States Patent
Carnagey, Sr. et al.

(10) Patent No.: US 6,777,029 B2
(45) Date of Patent: Aug. 17, 2004

(54) METHOD FOR DETERMINING PRODUCT COATING RATES FOR FLUIDIZED BEDS

(75) Inventors: Walter John Carnagey, Sr., Round Rock, TX (US); Bradley George Borgard, Cedar Park, TX (US); Kenneth Wayne Cox, Liberty Hill, TX (US)

(73) Assignee: Carbomedics Inc., Austin, TX (US)

( * ) Notice: Subject to any disclaimer, the term of this patent is extended or adjusted under 35 U.S.C. 154(b) by 0 days.

(21) Appl. No.: 10/133,890

(22) Filed: Apr. 27, 2002

(65) Prior Publication Data
US 2003/0203106 A1 Oct. 30, 2003

(51) Int. Cl.$^7$ .......................... C23C 16/26; B05D 7/00
(52) U.S. Cl. .................. 427/213; 427/215; 427/249.1; 427/255.23; 427/255.5
(58) Field of Search ................................ 427/213, 215, 427/249.1, 255.23, 255.5, 2.4, 2.15, 8; 118/303, 712

(56) References Cited

U.S. PATENT DOCUMENTS

| | | | |
|---|---|---|---|
| 3,526,005 A | 9/1970 | Bokros et al. ................ 3/1 |
| 3,676,179 A | 7/1972 | Bokros ..................... 117/46 |
| 3,677,795 A | 7/1972 | Bokros et al. ............. 117/46 |
| 3,977,896 A | 8/1976 | Bokros et al. ............ 427/213 |
| 4,546,012 A | 10/1985 | Brooks ................... 427/213 |
| 4,594,270 A | 6/1986 | Brooks ................... 427/213 |
| 5,328,713 A * | 7/1994 | Emken et al. .............. 427/8 |
| 5,514,410 A | 5/1996 | Ely et al. ................ 427/2.24 |
| 5,569,329 A | 10/1996 | Cox ...................... 118/716 |
| 5,891,517 A | 4/1999 | Cox ...................... 427/213 |
| 6,447,653 B1 * | 9/2002 | Debley et al. ......... 204/192.13 |

\* cited by examiner

Primary Examiner—Elena Tsoy
(74) Attorney, Agent, or Firm—Williams, Morgan & Amerson, P.C.

(57) ABSTRACT

The present invention is generally directed to a method of controlling a pyrolytic carbon deposition coating process performed in a fluidized bed. In one illustrative embodiment, the method comprises positioning a product to be coated in the fluidized bed, determining a coating rate of carbon material formed on the product in the fluidized bed, and determining a desired duration of the coating process by dividing a desired coating thickness for the product by the determined coating rate.

3 Claims, 2 Drawing Sheets

US 6,777,029 B2

METHOD FOR DETERMINING PRODUCT COATING RATES FOR FLUIDIZED BEDS

BACKGROUND OF THE INVENTION

1. Field of the Invention

The present invention is generally related to the field of pyrolytic carbon coating techniques, and, more particularly, to a method of controlling the coating process and determining the coating rate of pyrolytic carbon on a product positioned in a fluidized bed.

2. Description of the Related Art

It is desirable to deposit pyrolytic carbon coatings on certain objects. For example, uranium particles can be coated with a pyrolytic carbon which, in part, forms a pressure-retentive shell allowing the coated particles to be fabricated into fuel rods for use in nuclear reactors. Another use for such coatings is for heart valves and other biomedical components because a pyrolytic carbon coating does not react with blood. For example, pyrolytic carbon heart valves may be formed by positioning a reverse mold comprised of graphite in a fluidized bed, and forming the carbon material on the mold. Thereafter, the pyrolytic carbon material that comprises the heart valve may be removed from the reverse mold.

Pyrolytic carbon is usually deposited on an object by thermally decomposing gaseous hydrocarbons or other carbonaceous substances in vaporous form in the presence of the object. A pyrolytic carbon deposition process is typically performed in a fluidized bed apparatus. The apparatus is generally comprised of a bed of very small particles (usually of a size measured in microns) positioned within the apparatus, a means for circulating a variety of process gases through the bed of particles, and a means for heating the apparatus, e.g., typically an RF heating coil. The products that are desired to be coated are positioned within the bed of particles. Typically, the products will be relatively large relative to the size of the particles within the bed. This arrangement provides sufficient available total surface area to assure that pyrolytic carbon having the desired crystalline form will be deposited on the product. In addition, the random motion of the relatively large products in the fluidized bed provides for a relatively uniform deposition of the carbon material on all surfaces of the product.

However, whenever such submillimeter particles are being coated in a fluidized bed, the total surface area of the particles begins to increase significantly as the diameters of the pyrolytic carbon-coated particles grow. This change in the available deposition surface area in the fluidized bed affects the coating rate and results in a change in the physical characteristics of the pyrolytic carbon being deposited if the other coating variables, e.g., coating temperature, gas flow rate and gas composition, are held constant. Moreover, when the bed reaches some maximum size, it will collapse and thus limit the thickness of the carbon coating that can be deposited on levitated products within the bed under constant input conditions. Changes in the physical characteristics of the carbon deposited may be undesirable for any of a number of reasons.

As set forth above, the pyrolytic coating process is a relatively complicated process, the effectiveness of which depends upon a variety of interrelated factors. In general, what is desired is to be able to control such a deposition process to insure that the desired amount of pyrolytic carbon material is deposited on the products during the process. For example, with respect to the manufacture of heart valves comprised of pyrolytic carbon, the resulting valves must meet a relatively tight thickness specification. Heart valves that are manufactured too thin are rejected because, among other things, the parts will not provide the necessary structural strength for the completed device. On the other hand, heart valves that are too thick are also rejected because, among other things, the increased thickness results in a heart valve that is too rigid, thereby leading to undesirable stress levels in the heart valve when it is in service. Thus, better thickness control in pyrolytic carbon deposition processes is desired. Other efforts have been made to attempt to control variations in pyrolytic coating processes by attempting to maintain a constant bed area during a coating run. For example, such efforts have included attempts to maintain a constant bed weight, see, e.g., U.S. Pat. No. 5,328,713, and a constant differential pressure across the bed, see, e.g., U.S. Pat. No. 5,514,410. However, to date, thickness control of existing pyrolytic carbon coating techniques and methods is less than desirable.

The present invention is directed to a method and system that may solve, or at least reduce, some or all of the aforementioned problems.

SUMMARY OF THE INVENTION

The present invention is generally directed to a method of controlling a pyrolytic carbon deposition coating process performed in a fluidized bed. In one illustrative embodiment, the method comprises positioning a product to be coated in the fluidized bed, determining a coating rate of carbon material formed on the product in the fluidized bed, and determining a desired duration of the coating process by dividing a desired coating thickness for the product by the determined coating rate.

In a further embodiment, the method comprises collecting a quantity of particles from the fluidized bed, the collected particles being coated with a pyrolytic carbon material, determining a weight of the collected particles, and determining a deposition rate of the pyrolytic carbon material on the collected particles. The method further comprises determining a feed rate of additional bed particles added to the fluidized bed, determining a new weight of the fluidized bed based upon A) the initial bed weight, B) the determined deposition rate of the pyrolytic carbon material, C) the determined weight of the collected particles, and D) the feed rate of the additional particles. The method concludes with the steps of calculating a coating rate for a product positioned in the fluidized bed based upon, in part, the determined new weight of the bed, and determining a desired duration of the coating process by dividing a desired coating thickness by the determined coating rate.

BRIEF DESCRIPTION OF THE DRAWINGS

The invention may be understood by reference to the following description taken in conjunction with the accompanying drawings, in which like reference numerals identify like elements, and in which.

Figure 1:
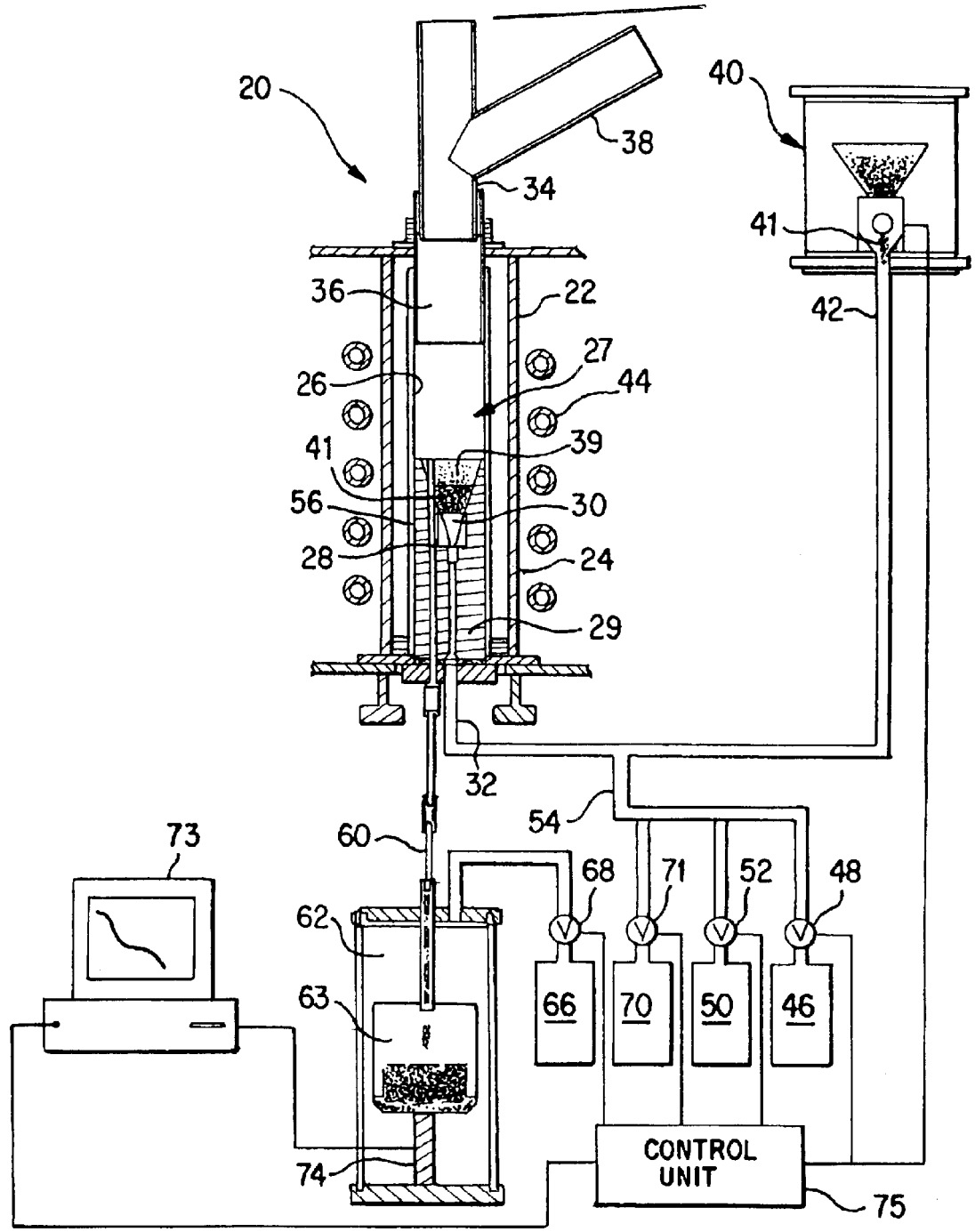
FIG. 1 is a front elevational view, partly section and partly schematic, of a fluidized bed apparatus that may be employed with the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with health-related (or human-related), system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. The relative sizes of the various features and structures depicted in the drawings may be exaggerated or reduced as compared to the size of those features or structures on real-world devices. Moreover, the drawings may be schematic in nature and they may not depict all the details and utilities required to perform a pyrolytic carbon coating process. Nevertheless, the attached drawings are included to describe and explain illustrative examples of the present invention.

In general, the present invention is directed to a method of controlling a pyrolytic carbon deposition process and to determining product coating rates for such a process. As will be recognized by those skilled in the art after a complete reading of the present application, the methods disclosed herein may be employed in manufacturing a variety of different products. For example, the present invention may be employed in the context of manufacturing artificial heart valves. However, the present invention should not be considered as limited to such a specific application unless such limitation is specifically set forth in the appended claims.

A fluidized bed apparatus 20 for applying a pyrolytic carbon coating to a product is generally depicted in FIG. 1. The apparatus 20 includes a furnace 22 having a cylindrical outer shell 24. The furnace shell 24 supports a coating enclosure 27 which is defined by a tube 26 having an insert 28 affixed thereto at its lower end and a nozzle 29. The insert 28 provides the internal coating enclosure 27 with a conical bottom surface 30. A central passageway 32 extends vertically upward through the nozzle 29 and the insert 28, coaxial with the tube 26, and the coating and fluidizing atmosphere is supplied upwardly through the passageway 30.

The upper end of the tube 26 is provided with a removable closure 34 that may be coupled to the tube in any suitable manner. The closure 34 includes a central exit passageway 36 through which the fluidizing and coating gases leave the furnace enclosure and which is connected to an exit conduit 38 through which the gases may be routed for subsequent treatment if desired. A particle injection device 40 is mounted above the closure and is designed to feed minute particles 41 into the coating enclosure 27 at a desired rate by feeding them via line 42 and central passageway 32 into the coating enclosure 27. The particles 41 supplied by the particle injection device 40 become a part of the fluidized bed 39. The particle injection device 40 also comprises a load cell (not shown) that may be used to determine the weight of the particles 41 added by the injection device 40 over any period of time. A heating means 44 is provided for heating the active deposition region of the furnace and the particles and products being coated to the desired deposition temperature. The heating means 44 may be, for example, an induction coil.

In the fluidized bed coating apparatus 20, sometimes referred to hereinafter as a "steady-state bed", the bed 39 of minute particles 41 is levitated generally near the bottom of the heating enclosure in approximately the location shown in FIG. 1 by the upward flowing gas stream provided via central passageway 32. The gas stream is usually made up of a mixture of an inert fluidizing gas plus a carbonaceous substance, such as a gaseous hydrocarbon, for example, methane, ethane, propane, butane or acetylene, or some other carbon-containing substance that is gaseous or easily vaporizable. The various process gases used in the fluidized bed apparatus 20 may be supplied by a variety of techniques. For example, a source 46 of hydrocarbon gas that is equipped with a flow-regulating valve arrangement 48 may be provided. A source 50 of inert gas, for example, helium, argon or nitrogen, that is likewise equipped with a suitable flow-regulating valve arrangement 52 may also be provided. A source 70 of silicon with an associated control valve 71 is also provided. In a preferred embodiment, the silicon source is MTS (methyl trichloro silane). Other sources may also be used. These three sources flow into a common line 54 which connects to the central passageway 32 in the insert 28.

The total flow of the gas upward through the coating enclosure 27 is regulated so that the fluidized bed 39 occupies the region near the bottom of the tube 26 as depicted in FIG. 1. The upward flow of the gaseous atmosphere through the central passageway 32 causes a generally annular flow pattern to be established in the fluidized bed region, with the minute particles 41 traveling upward in the central portion of the enclosure and then downward generally along the outer perimeter thereof. When particles having a density of at least about 3 grams/cm$^3$ (i.e., greater than the density of the carbon coating) are used, they will gradually become less dense as they grow in size. The smaller uncoated particles 41 tend to remain in the lower portion of the bed 39 while the less dense coated particles 41 are levitated to the upper portion of the bed. A preferred material for the particles is zirconium oxide which has a density of about 5.5 grams/cm$^3$.

Figure 2:
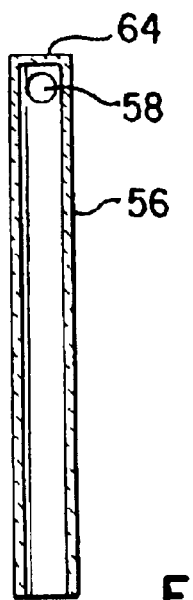
FIG. 2 is a side view of an illustrative weir tube that may be employed with the fluidized bed apparatus.

A weir tube 56, formed of a refractory material, such as graphite or mullite, extends through a vertical hole in the nozzle 29 and through a portion of the bed 39 and thereabove adjacent a side of the bed. A spillover hole or entrance 58 in the tube 56 defines a predetermined maximum level for the bed of particles, as depicted in FIG. 2. When this level is reached, the continuous addition of seed particles 41 via the particle injection device 40 in concert with the fluidization of the bed 39 caused by the upward flowing gas stream results in withdrawal of particles 41 having substantial coating thicknesses through the weir tube 56. An exit conduit 60 receives the withdrawn particles from the weir tube 56 and channels them into a collection chamber 62 where they are received in a container or trap 63.

Referring to FIG. 2, the weir tube 56 is preferably provided with a hood 64 to close the upper end of the tube 56 against the entrance of airborne particles and dust. Due to the fluidization process, there is some bubbling and splashing of the particles predominately in the central portion of the bed. When the bubbles burst, particles are sprayed generally radially with respect to the vertical axis of the bed. As the gas bubbles tend to pick up particles from adjacent the bottom of the bed 39, the sprayed particles tend to be the smaller, relatively thin-coated ones, and therefore, it is not desired that such particles be withdrawn. It is important that the spillover hole 58 is positioned facing away from the central portion of the bed 39 where the bubbling is most likely to occur. More specifically, the spillover hole 58 should face at ninety degrees or greater with respect to the radius intersecting the axis of the weir tube 56. Furthermore, the weir tube 56 is preferably disposed away from the axis of the bed 39 by a distance equal to at least two-thirds of the spacing between the bed axis and the tube 26. Since the particles which become airborne due to bubbling of the bed do not travel circumferentially, the positioning of the spillover hole 58 facing away from the central portion of the bed 39 substantially eliminates the entrance of airborne particles in the spillover hole 58.

The collection chamber 62 is preferably pressurized with inert gas from a suitable source 66 with the rate of gas flow controlled by a valve 68. The flow of inert gas through the collection chamber 62 and up the weir tube 56 through the exit conduit 60 acts as a purge to prevent substantial quantities of dust from falling down into the collection chamber 62 thus maintaining clear the glass walls forming the chamber to permit observation by the operator that the apparatus is functioning properly. The purge gas may flow at an approximately constant, relatively slow rate sufficient to prevent movement of substantial quantities of dust into the collection chamber 62, but insufficient to prevent coated particles from falling down the weir tube 56 into the collection chamber 62.

The apparatus 20 further preferably comprises a load cell 74 positioned under the trap 63, a control unit 75 coupled to the control valves 48, 52, 71 and 68, and a supervisory computer 73. In general, the supervisory computer 73 may receive a variety of data inputs regarding the operation of the coating apparatus 20, e.g., the weight of material collected in the trap 63, the feed rate of new particles 41 added to the apparatus 20 by the injection device 40, the status of the various control valves 48, 52, 71 and 68, and the associated gas flow rates of the gases supplied to the apparatus 20. Although the drawing depicts a separate control unit 75 and a supervisory computer 73, it will be recognized that a single computing entity could be used with the present invention. Further details of the coating apparatus 20 are described in U.S. Pat. No. 4,546,012, which is hereby incorporated by reference in its entirety.

Operation of the apparatus 20 of the present invention will now be generally described. An initial supply of particles 41, along with the products to be coated (not shown), are placed in the coating enclosure 27 and the enclosure is brought up to its operating temperature of approximately 1200–2000° C. with the fluidizing gas, e.g., nitrogen, flowing. After the operating temperature is attained, the coating gas valve 48 is opened so that the coating gas and the fluidizing gas both flow through the input line 54. The bed level starts to rise slowly due to the particles 41 in the bed 39 acquiring a pyrolytic carbon coating because of the thermal decomposition of the gaseous carbonaceous substances.

After a period of time, the particle injection device 40 is turned on to add seed particles 41 to the bed 39 which increases the rate at which the bed 39 rises. There is also bubbling of the fluidized particles 41 in the central region of the bed 39 above the location of the central gas inlet passageway 32. Although such bubbling and splashing causes particle movement above the predetermined level established by the position of the spillover hole 58 in the weir tube 56, such airborne particles cannot enter the tube 56 in significant quantity because the spillover hole 58 faces away from the central bed region. Of course, the circulation provided by the fluidization causes the less dense coated particles to levitate with the just added seed particles and only lightly coated particles, which have greater densities, more likely to remain near the bottom of the bed 39. When the bed level reaches the spillover hole 58, coated particles enter the hole 58 where they fall down the weir tube 56, through the exit conduit 60 and are collected in the trap 63 disposed in chamber 62. The provision of hood 64 and the slow purge of inert gas up the weir tube 56 insure that the major portion of dust is removed through the exit conduit 38 and does not travel with the particles through the weir tube 56.

During this process, the supervisory computer 73 monitors the operation of the apparatus 20. More particularly, the supervisory computer 73 is provided with data as to the feed rate (grams/min) of new particles 41 added to the process by the particle injection device 40, and with data as to the weight of coated particles collected in the trap 63. Moreover, the supervisory computer 73 may also be provided with data as to the flow rates of the various gases supplied to the apparatus 20 via its communication with the control unit 75.

Upon completion of the coating process, the apparatus 20 is disassembled and the coated products are removed. It will be appreciated that the contents of the container or trap 63 include small and large particles. The contents of the trap 63 can be screened, the large particles may be disposed and the smaller particles may be recycled.

By way of background, the coating rate for a given product positioned in the fluidized bed 39 is defined by five factors: the deposition rate of the pyrolytic carbon, the surface area of the bed, the surface area of the coating apparatus (within the coating zone), the surface area of the products in the bed that are being coated, and the product levitation height within the bed. Although the average coater surface area, product surface area and product levitation height may be directly measured for a given process, this is not necessary when similar coating conditions are used since the total effect of these parameters is approximately constant. Thus, for similar coating conditions, the primary factors affecting product coating rate variation are the deposition rate of the pyrolytic carbon and the bed surface area.

Moreover, it is important to understand the normal variations in the weight of the fluidized bed 39 with a level-controlled coating apparatus. Typically, the bed 39 initially increases in weight since few of the particles 41 are removed by the weir tube 56 during the initial stages of the process due to the relatively high average density of the particles 41 comprising the initial bed mass. However, as the individual bed particles 41 are coated, the average density of the coated particles decreases and the coated particles 41 tend to levitate higher in the coating apparatus, thus increasing the spill-over rate of coated particles 41 that are collected in the trap 63. Eventually, the bed weight will peak as the withdrawal rate of material collected in the trap 63 equals the deposition rate of the pyrolytic carbon within the coating apparatus. Beyond this point, without further intervention, the bed weight will begin to decrease. However, adding additional particles 41 to the bed 39, via the particle injection device 40, results in an approximate steady-state average particle size, and the more heavily coated bed particles are preferentially withdrawn via the weir tube 56. This process results in an approximately steady-state bed weight for the coating apparatus 20, as the sum of the pyrolytic carbon deposition rate and new particle feed rate approximately equal the rate of material withdrawn via the weir tube 56. Thus, the overall process results in an initially increasing bed weight, then a decreasing bed weight until approximately steady-state conditions are reached.

Based upon this understanding of bed variations as a function of time in a typical fluidized bed used in pyrolytic carbon coating processes, it is possible to determine the pyrolytic carbon deposition rate by monitoring, in some cases continuously, the weight of material collected in the trap 63. In one embodiment, the deposition rate may be determined by waiting until steady-state conditions are achieved, and then calculating the pyrolytic carbon deposition rate by subtracting the new particle feed rate from the withdrawal rate. As another alternative, the deposition rate of the pyrolytic carbon may be determined by analyzing historically obtained data and creating a model of the pyrolytic deposition rate as a function of trap weight at one or more specified points in time within a given coating run.

Part of the process described herein involves monitoring the trap weight (TW) during the course of a run. This monitoring may be continuous, or it may be done intermittently. Moreover, such monitoring may be performed over any period of the coating run. Typically, the trap weight (TW) is monitored continuously during a run. The trap weight (TW) is determined by the load cell 74, and this information is provided to the supervisory computer 73. By observing how the trap weight (TW) increases with time, the deposition rate (DR) of the pyrolytic carbon onto the bed particles 41 collected in the trap 63 may be determined. One illustrative formula that may be used for this purpose is as follows:

$$DR = a_0 + a_1 TW_1 + a_2 TW_2 + a_3 TW_3 + a_4 TW_4 + a_5 TW_5 + a_6 TW_6 \quad \text{(Equation 1)}$$

where: DR=pyrolytic carbon deposition rate on bed particles in grams/min $TW_1$=average trap weight for a first time period, e.g., 0–50 minutes $TW_2$ average trap weight for a second time period, e.g., 50–100 minutes $TW_3$ average trap weight for a third time period, e.g., 100–150 minutes $TW_4$ average trap weight for a fourth time period, e.g., 150–200 minutes $TW_5$=average trap weight for a fifth time period, e.g., 200–250 minutes $TW_6$ average trap weight for a sixth time period, e.g., 250–300 minutes The values for $a_1$–$a_6$ are empirically determined constants that are determined based upon an analysis of historical process data. The constant $a_0$ represents an offset value, and it is expressed in units of grams/min. The other constants $a_1$–$a_6$ are in units of 1/min. The breakdown of the time periods reflected above, i.e., 6–50 minute time periods, is somewhat discretionary. Other time periods, e.g., 12–20 minute time periods over 240 minutes, could have also been used. The values for $a_0$–$a_6$ may be determined by a variety of known statistical techniques. For example, data may be collected for a number of coating runs and input into a modeling program, such as JMP or Statistica. Thereafter, the program may perform a least-squares best-fit analysis to determine the optimal values for the constants $a_0$–$a_6$. Typical values for $a_0$ may be approximately −2 to +2. Typical values for $a_1$–$a_6$ may range from approximately −0.01 to +0.01. Of course, these values may vary depending upon a variety of factors, e.g., the particular apparatus 20 used, the process gas composition and flow rates, etc.

After the deposition rate (DR) is determined, then the changes in the bed weight (BW) may be determined. This may be accomplished by a standard mass balance equation:

$$BW_1 = BW_0 + DR(T_1 - T_0) + FR(T_1 - T^0) - (TW_1 TW_0) \quad \text{(Equation 2)}$$

where: $BW_1$=bed weight at cut time $T_1$(grams)

$BW_0$=bed weight at time $T_0$ (grams)

DR=pyrolytic carbon deposition rate (grams/min)

FR=new particle feed rate (grams/min)

$TW_1$=trap weight at time $T_1$ (grams)

$TW_0$=trap weight at time $T_0$ (grams)

$T_1$–$T_0$=time period of interest (min)

Based upon the preceding mass balance equation, the average bed weight during a given period of time may be determined as follows:

$$BW_{avg} = BW_0 + \frac{\Theta \cdot (DR + FR)}{2} - \frac{\delta \cdot FR \cdot \left(1 + \frac{\Theta - \delta}{\Theta}\right)}{2} - TW_{avg} \quad \text{(Equation 3)}$$

where: $BW_{avg}$=average bed weight over time period of interest (grams)

$BW_0$=bed weight at time $T_0$ (grams)

$\Theta$=time period of interest (min)

DR=pyrolytic carbon deposition rate (grams/min)

FR=new particle feed rate (grams/min)

$\delta$=the delay period prior to feeding additional particles into the bed (min), e.g., 60 minutes $TW_{avg}$=the average trap weight during the time period $\theta$ (the initial trap weight being set to zero)

With the average bed weight known, the coating rate (CR ($\mu$m/min)) of pyrolytic carbon on the products positioned in the bed 39 may be determined, holding other coating parameters, e.g., temperature, gas flow rates, etc., constant. This may be determined from the following equation:

$$CR = m \frac{1}{BW_{avg}} + b \quad \text{(Equation 4)}$$

where: CR=product coating rate ($\mu$m/min)

$BW_{avg}$=average bed weight over time period of interest (grams)

The constants m and b are empirically derived constants based upon historical data. The constant m is expressed in units of grams($\mu$m)/min. The constant b is expressed in units of $\mu$m/min. The values of m and b may also be determined based upon an analysis of a collection of historical data using known statistical techniques to determine optimal values for these constants. Typical values for these constants may be approximately −0.020 to −0.003 for m and approximately 3.5–15 for b.

Once the product coating rate (CR) is determined, the duration (t) in minutes of the coating process to produce a desired product coating thickness (CT) in microns may be determined from the following equation:

$$t = \frac{CT}{CR} \quad \text{(Equation 5)}$$

The present methodology may also be accomplished by creating a model that is used to predict the product coating rate (CR). This model may be used to predict the product coating rate (CR) during steady state operations or during the start-up period before steady state conditions are reached. The model may be developed empirically using commonly known linear or non-linear techniques. The control model may be a relatively simple equation-based model, e.g., least-squares, linear, exponential, weighted average, etc., or a more complex model, such as a neural network model, principal component analysis (PCA) model, or a projection to latent structures (PLS) model. The specific implementation of the model may vary depending on the modeling technique selected. The model may be generated by the supervisory computer 72 or, alternatively, it may be generated by a different processing resource (not shown) and stored on the supervisory computer 72 after being developed. The model may be trained based on historical data collected from numerous processing runs of the apparatus 20.

Figure 3:
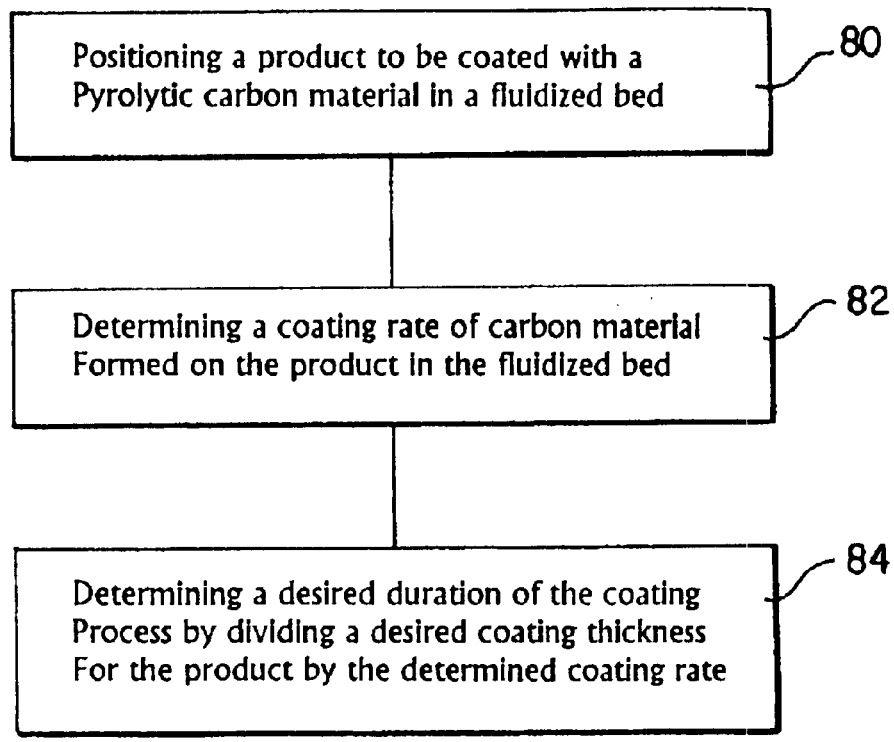
FIG. 3 is a flowchart depicting one illustrative embodiment of one of the methods of the present invention.

The present invention is generally directed to a method of controlling a pyrolytic carbon deposition coating process performed in a fluidized bed. One illustrative embodiment of the present invention is depicted in flowchart form in FIG. 3. As shown therein, in one illustrative embodiment, the method comprises positioning a product to be coated in a fluidized bed, as recited at block 80, determining a coating rate of carbon material formed on the product in the fluidized bed, as indicated at block 82, and determining a desired duration of the coating process by dividing a desired coating thickness for the product by the determined coating rate, as set forth in block 84. The product coating rate may be determined by calculation or predicted with the use of a model.

In another illustrative embodiment, the method comprises collecting a quantity of particles from the bed, the collected particles being coated with a pyrolytic carbon material, determining a weight of the collected particles, and determining a deposition rate of the pyrolytic carbon material on the collected particles. The method further comprises determining a feed rate of additional bed particles added to the fluidized bed, determining a new weight of the fluidized bed based upon the initial bed weight, the determined deposition rate of the pyrolytic carbon material, the determined weight of the collected particles, and the feed rate of the additional particles. The method concludes with the additional steps of calculating a coating rate for a product positioned in the fluidized bed based upon, in part, the determined new weight of the bed, and determining a desired duration of the coating process by dividing a desired coating thickness by the determined coating rate.

Through use of the present invention, the coating rate (CR) of pyrolytic carbon on products positioned within the apparatus 20 may be determined. In turn, the determined coating rate (CR) may be used to determine the desired duration (t) of the coating process to produce the desired coating thickness (CT) on the products. By directly measuring or determining the coating rate (CR) of the carbon material on the products, better process control may be achieved, thereby increasing production capabilities and product yields. That is, instead of trying to reduce variations in product coating thicknesses, the present invention may be used to determine a product coating rate. With this rate determined, the duration of the deposition process for a desired product coating thickness may be determined.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method of controlling a pyrolytic carbon coating process performed in a fluidized bed coating apparatus, said fluidized bed having an initial weight and being comprised of a plurality of particles, the method comprising:

collecting a quantity of particles from said bed, said collected particles being coated with a pyrolytic carbon material;

determining a weight of said collected particles;

determining a deposition rate of said pyrolytic carbon material on said collected particles by analyzing historically obtained data and creating a model of the deposition rate as a function of trap weight at one or more specified points in time within a given coating run, wherein determining a deposition rate of said pyrolytic carbon material on said collected particles comprises determining a deposition rate of said pyrolytic carbon material on said collected particles over a period of time using the following formula:

$$DR = a_0 + a_1 TW_1 + a_2 TW_2 + a_3 TW_3 + a_4 TW_4 + a_5 TW_5 + a_6 TW_6$$

where: DR=pyrolytic carbon deposition rate on bed particles in grams/min $TW_1$=average trap weight for a first time period $TW_2$=average trap weight for a second time period $TW^3$=average trap weight for a third time period $TW^4$=average trap weight for a fourth time period $TW^5$=average trap weight for a fifth time period, and $TW_6$=average trap weight for a sixth time period;

determining a feed rate of additional bed particles added to said fluidized bed during said process;

determining a new weight of said fluidized bed based upon said initial bed weight, said determined deposition rate of said pyrolytic carbon material, said determined weight of said collected particles, and said feed rate of said additional particles;

calculating a coating rate for a product positioned in said fluidized bed based upon, in part, said determined new weight of said bed; and determining a desired duration of said coaxing process by dividing a desired coating thickness by said determined coating rate.

2. A method of controlling a pyrolytic carbon coating process performed in a fluidized bed coating apparatus, said fluidized bed having an initial weight and being comprised of a plurality of particles, the method comprising:

collecting a quantity of particles from said bed, said collected particles being coated with a pyrolytic carbon material;

determining a weight of said collected particles;

determining a deposition rate of said pyrolytic carbon material on said collected particles;

determining a feed rare of additional bed particles added to said fluidized bed during said process;

determining a new weight of said fluidized bed based upon said initial bed weight, said determined deposition rate of said pyrolytic carbon material, said determined weight of said collected particles, and said feed rate of said additional particles, comprising use of the following formula:

$$BW_{avg} = BW_0 + \frac{\Theta \cdot (DR + FR)}{2} - \frac{\delta \cdot FR \cdot \left(1 + \frac{\Theta - \delta}{\Theta}\right)}{2} - TW_{avg}$$

where: $BW_{avg}$=average bed weight over time period of interest (grams)
$BW_0$=bed weight at time $T_0$ (grams)
$\Theta$=time period of interest (min)
DR=pyrolytic carbon deposition rate (grams/min)
FR=new particle feed rate (grams/min)
$\delta$=the delay period prior to feeding additional particles into the bed (min), and
$TW_{avg}$=the average trap weight during the time period $\theta$ (the initial trap weight being act to zero);

calculating a coating rate for a product positioned in said fluidized bed based upon, in part, said determined new weight of said bed; and determining a desired duration of said coating process by dividing a desired coating thickness by said determined coating rate.

3. A method of controlling a pyrolytic carbon coating process performed in a fluidized bed coating apparatus, said fluidized bed having an initial weight and being comprised of a plurality of particles, the method comprising:

collecting a quantity of particles from said bed, said collected particles being coated with a pyrolytic carbon material;

determining a weight of said collected particles;

determining a deposition rate of said pyrolytic carbon material on said collected particles;

determining a feed rate of additional bed particles added to said fluidized bed during said process;

determining a new weight of said fluidized bed based upon said initial bed weight, said determined deposition rate of said pyrolytic carbon material, said determined weight of said collected particles, and said feed rate of said additional particles;

calculating a coating rate for a product positioned in said fluidized bed based upon, in part, said determined new weight of said bed and based upon the following formula:

$$CR = m \frac{1}{BW_{avg}} + b,$$

where: CR=product coating rate ($\mu$m/min)
$BW_{avg}$=average bed weight over time period of interest (grams)
m is a constant having units of grams($\mu$m)/min, and
b is a constant having units of $\mu$m/min; and determining a desired duration of said coating process by dividing a desired coating thickness by said determined coating rate.

* * * * *